(12) United States Patent
Hsu

(10) Patent No.: US 11,177,358 B2
(45) Date of Patent: Nov. 16, 2021

(54) SEMICONDUCTOR DEVICE INCLUDING SOURCE/DRAIN EPITAXIAL LAYER HAVING FACETS AND MANUFACTURING METHOD THEREOF

(71) Applicant: TAIWAN SEMICONDUCTOR MANUFACTURING CO., LTD., Hsinchu (TW)

(72) Inventor: Chao-Wei Hsu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/930,435

(22) Filed: May 12, 2020

(65) Prior Publication Data
US 2020/0273957 A1     Aug. 27, 2020

Related U.S. Application Data

(63) Continuation of application No. 16/426,620, filed on May 30, 2019, now Pat. No. 10,680,075.

(60) Provisional application No. 62/738,666, filed on Sep. 28, 2018.

(51) Int. Cl.
*H01L 29/417*     (2006.01)
*H01L 21/8234*     (2006.01)
*H01L 29/78*     (2006.01)
*H01L 29/66*     (2006.01)

(52) U.S. Cl.
CPC .......... *H01L 29/41791* (2013.01); *H01L 21/823431* (2013.01); *H01L 29/66795* (2013.01); *H01L 29/785* (2013.01)

(58) Field of Classification Search
None
See application file for complete search history.

(56) References Cited

U.S. PATENT DOCUMENTS

| | | | |
|---|---|---|---|
| 8,405,155 B2 * | 3/2013 | Yeh | .......... H01L 29/7834 257/369 |
| 8,962,400 B2 | 2/2015 | Tsai et al. | |
| 9,082,851 B2 | 7/2015 | Ramachandran et al. | |
| 9,093,514 B2 | 7/2015 | Tsai et al. | |

(Continued)

FOREIGN PATENT DOCUMENTS

| | | |
|---|---|---|
| JP | 2009-016865 A | 1/2009 |
| KR | 10-2014-0112367 A | 9/2014 |

(Continued)

OTHER PUBLICATIONS

Non-Final Office Action issued in U.S. Appl. No. 16/426,620, dated Aug. 28, 2019.

(Continued)

*Primary Examiner* — J. E. Schoenholtz
(74) *Attorney, Agent, or Firm* — McDermott Will & Emery LLP

(57) ABSTRACT

A semiconductor device includes a fin structure disposed over a substrate, wherein the fin structure including a channel layer and extending in a first direction, a gate structure including a gate electrode layer and a gate dielectric layer, sidewall spacers disposed on opposite side faces of the gate structure, and a source/drain structure including an epitaxial layer having at least seven facets in a cross section along the first direction.

20 Claims, 13 Drawing Sheets

(56) References Cited

U.S. PATENT DOCUMENTS

| | | |
|---|---|---|
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |
| 10,680,075 B2 * | 6/2020 | Hsu ................... H01L 29/7848 |
| 2005/0126202 A1 | 6/2005 | Shoukyuu et al. |
| 2005/0156202 A1 * | 7/2005 | Rhee ................ H01L 29/66795 257/213 |
| 2012/0074468 A1 * | 3/2012 | Yeh ................... H01L 29/7848 257/255 |
| 2013/0270628 A1 | 10/2013 | Huang et al. |
| 2014/0167163 A1 * | 6/2014 | Cheng ................. H01L 21/845 257/347 |
| 2014/0273380 A1 | 9/2014 | Liu et al. |
| 2014/0312393 A1 | 10/2014 | Rodder et al. |
| 2015/0145064 A1 | 5/2015 | Ramachandran et al. |
| 2016/0181381 A1 | 6/2016 | Liu et al. |
| 2016/0308048 A1 | 10/2016 | Ching et al. |
| 2016/0329250 A1 | 11/2016 | Ching et al. |
| 2017/0005011 A1 | 1/2017 | Ching et al. |

FOREIGN PATENT DOCUMENTS

| | | |
|---|---|---|
| KR | 10-2016-0123211 A | 10/2016 |
| KR | 10-2016-0147626 A | 12/2016 |

OTHER PUBLICATIONS

Notice of Allowance issued in U.S. Appl. No. 16/426,620, dated Jan. 10, 2020.

* cited by examiner

SEMICONDUCTOR DEVICE INCLUDING SOURCE/DRAIN EPITAXIAL LAYER HAVING FACETS AND MANUFACTURING METHOD THEREOF

RELATED APPLICATIONS

This application is a continuation of U.S. application Ser. No. 16/426,620 filed on May 30, 2019, which claims priority of U.S. Provisional Application No. 62/738,666 filed on Sep. 28, 2018, the entire contents of which are incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (Fin FET). Fin FET devices typically include semiconductor fins with high aspect ratios and in which channel and source/drain regions of semiconductor transistor devices are formed. A gate is formed over and along the sides of the fin structure (e.g., wrapping) utilizing the advantage of the increased surface area of the channel and source/drain regions to produce faster, more reliable and better-controlled semiconductor transistor devices. In some devices, strained materials in source/drain (S/D) portions of the Fin FET utilizing, for example, silicon germanium (SiGe), silicon carbide (SiC), and/or silicon phosphide (SiP) may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
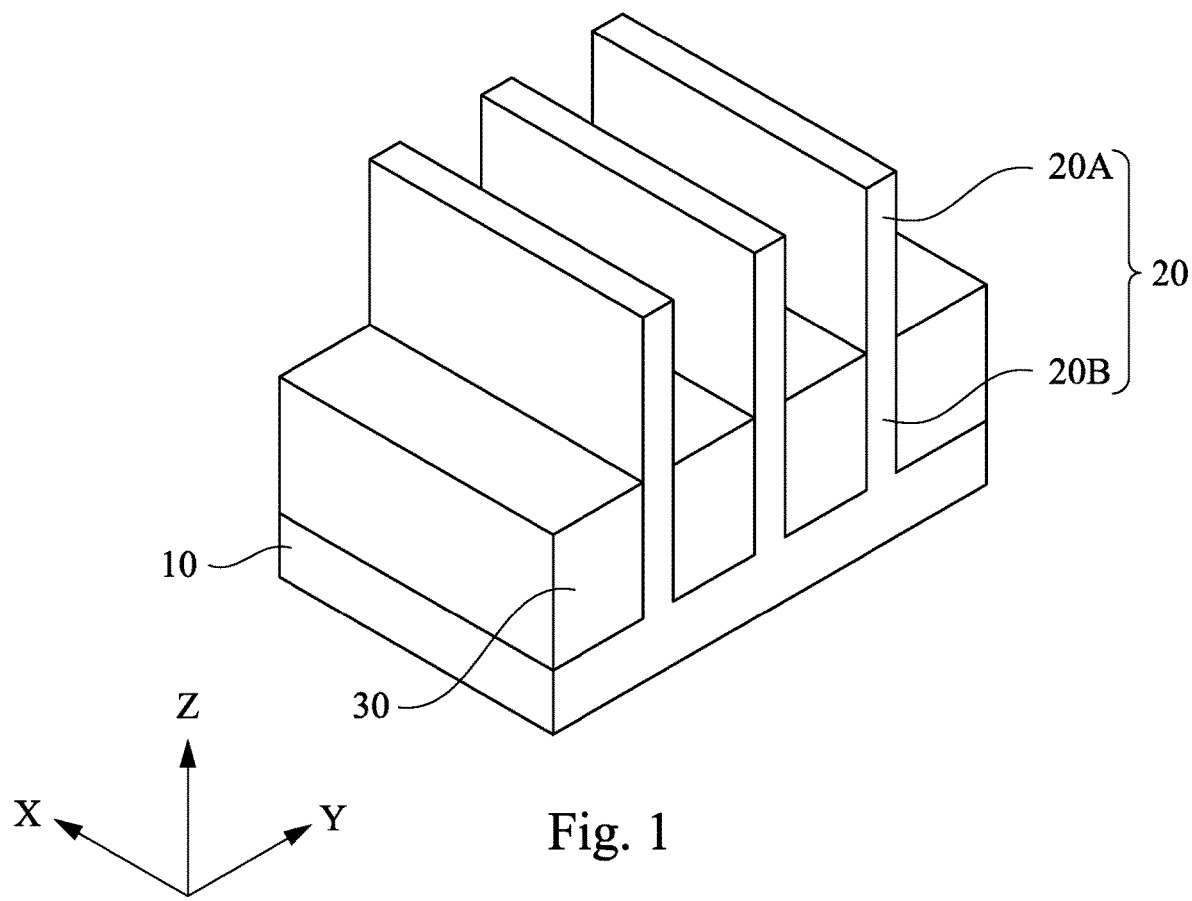
FIG. 1 shows one of the various stages of a sequential manufacturing operation of a semiconductor FET device according to an embodiment of the present disclosure.

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

One of the factors to determine device performance of a field effect transistor (FET), such as a fin FET (FinFET), is a shape of an epitaxial source/drain structure. In particular, when a source/drain region of a FinFET is recessed and then an epitaxial source/drain layer is formed therein, the etching substantially defines the shape of the epitaxial source/drain structure. For example, when isotropic etching is used, ion bumping damage leads to a round source/drain shape, which may cause insufficient device performance. The round source/drain shape may have an undesirable surface condition due to the ion damage, and have a relatively long distance between a channel region and the source/drain region (shadow effect by poly space). By adjusting etching conditions, it is possible to deeply etch the source/drain region, together with the use of thinner gate sidewall spacers, it may be possible to improve a FinFET current density. However, the deeply shaped source/drain structure may cause an increase of leakage current, and the thin sidewall spacers may have a higher capacitance (affecting AC performance).

In the present disclosure, an octagonal shape is employed for a source/drain epitaxial structure to solve these problems. By using the octagonal shape, it is possible to decrease a distance between the source/drain to the channel (S/D proximity), thereby improving FinFET current density. Further, a flat <110> sidewall parallel to the fin channel can decrease a drain-induced barrier lowering (DIBL) effect, realizing a better electrical field control. An optimal fin-depth/source/drain shape-depth ratio can improve a FinFET's Ion/Ioff current ratio, and an improved surface condition can decrease the Si/epitaxial layer interface defects.

More specifically, in the octagonal source/drain structure, a distance between the channel to the <110> sidewall of the octagon can be decreased, and <110> sidewall surface roughness can be reduced. In some embodiments, the octagonal source/drain structure has at least a 5 nm <110> orientation face parallel to the side face of the gate electrode.

FIGS. 1-10 show views of various stages of a sequential manufacturing operation of a semiconductor device according to the present disclosure. It is understood that additional operations may be provided before, during, and after the processes shown by FIGS. 1-10, and some of the operations described below can be replaced or eliminated for additional embodiments of the method. The order of the operations/processes may be interchangeable.

As shown in FIG. 1, one or more fin structures 20 are fabricated over a substrate 10. Further, an isolation insulating layer (e.g., shallow trench isolation: STI) as shown in FIG. 1 is formed. The fin structure 20 includes a channel region 20A and a well region 20B.

The substrate 10 is, for example, a p-type silicon substrate with an impurity concentration in a range of about $1 \times 10^{15}$ cm$^{-3}$ to about $1 \times 10^{18}$ cm$^{-3}$. In other embodiments, the substrate 10 is an n-type silicon substrate with an impurity concentration in a range of about $1 \times 10^{15}$ cm$^{-3}$ to about $1 \times 10^{18}$ cm$^{-3}$. Alternatively, the substrate 10 may comprise another elementary semiconductor, such as germanium; a compound semiconductor including IV-IV compound semiconductors such as SiC and SiGe, III-V compound semiconductors such as GaAs, GaP, GaN, InP, InAs, InSb, GaAsP, AlGaN, AlInAs, AlGaAs, GaInAs, GaInP, and/or GaInAsP; or combinations thereof. In one embodiment, the substrate 10 is a silicon layer of an SOI (silicon-on insulator) substrate. Amorphous substrates, such as amorphous Si or amorphous SiC, or insulating material, such as silicon oxide may also be used as the substrate 10. The substrate 10 may include various regions that have been suitably doped with impurities (e.g., p-type or n-type conductivity).

The fin structures 20 may be patterned by any suitable method. For example, the fin structures 20 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 20.

As shown in FIG. 1, three fin structures 20 extending in the X direction are disposed adjacent to each other in the Y direction. However, the number of the fin structures is not limited to three. The numbers may be one, two, four or five or more. In addition, one of more dummy fin structures may be disposed adjacent to both sides of the fin structures 20 to improve pattern fidelity in patterning processes. The width of the fin structure 20 is in a range of about 5 nm to about 40 nm in some embodiments, and may be in a range of about 7 nm to about 15 nm in certain embodiments. The height of the fin structure 20 is in a range of about 100 nm to about 300 nm in some embodiments, and may be in a range of about 50 nm to 100 nm in other embodiments. The space between the fin structures 20 is in a range of about 5 nm to about 80 nm in some embodiments, and may be in a range of about 7 nm to 15 nm in other embodiments. One skilled in the art will realize, however, that the dimensions and values recited throughout the descriptions are merely examples, and may be changed to suit different scales of integrated circuits. In some embodiments, the Fin FET device is an n-type Fin FET. In other embodiments, the Fin FET device is a p-type Fin FET.

After the fin structures 20 are formed, an isolation insulating layer 30 is formed over the fin structures 20.

The isolation insulating layer 30 includes one or more layers of insulating materials such as silicon oxide, silicon oxynitride or silicon nitride, formed by LPCVD (low pressure chemical vapor deposition), plasma-CVD or flowable CVD. In the flowable CVD, flowable dielectric materials instead of silicon oxide are deposited. Flowable dielectric materials, as their name suggests, can "flow" during deposition to fill gaps or spaces with a high aspect ratio. Usually, various chemistries are added to silicon-containing precursors to allow the deposited film to flow. In some embodiments, nitrogen hydride bonds are added. Examples of flowable dielectric precursors, particularly flowable silicon oxide precursors, include a silicate, a siloxane, a methyl silsesquioxane (MSQ), a hydrogen silsesquioxane (HSQ), an MSQ/HSQ, a perhydrosilazane (TCPS), a perhydro-polysilazane (PSZ), a tetraethyl orthosilicate (TEOS), or a silyl-amine, such as trisilylamine (TSA). These flowable silicon oxide materials are formed in a multiple-operation process. After the flowable film is deposited, it is cured and then annealed to remove un-desired element(s) to form silicon oxide. The flowable film may be doped with boron and/or phosphorous. The isolation insulating layer 30 may be formed by one or more layers of SOG, SiO, SiON, SiOCN and/or fluoride-doped silicate glass (FSG) in some embodiments.

After forming the isolation insulating layer 30 over the fin structures 20, a planarization operation is performed so as to remove part of the isolation insulating layer 30 and the mask layer (the pad oxide layer and the silicon nitride mask layer). The planarization operation may include a chemical mechanical polishing (CMP) and/or an etch-back process. Then, the isolation insulating layer 30 is further removed so that an upper part of the fin structure 20, which is to become a channel layer, is exposed, as shown in FIG. 1.

In certain embodiments, the partial removing of the isolation insulating layer 30 may be performed using a wet etching process, for example, by dipping the substrate in hydrofluoric acid (HF). In another embodiment, the partial removing of the isolation insulating layer 30 may be performed using a dry etching process. For example, a dry etching process using $CHF_3$ or $BF_3$ as etching gases may be used.

After forming the isolation insulating layer 30, a thermal process, for example, an anneal process, may be performed to improve the quality of the isolation insulating layer 30. In certain embodiments, the thermal process is performed by using rapid thermal annealing (RTA) at a temperature in a range of about 900° C. to about 1050° C. for about 1.5 seconds to about 10 seconds in an inert gas ambient, such as an $N_2$, Ar or He ambient.

Figure 2A:
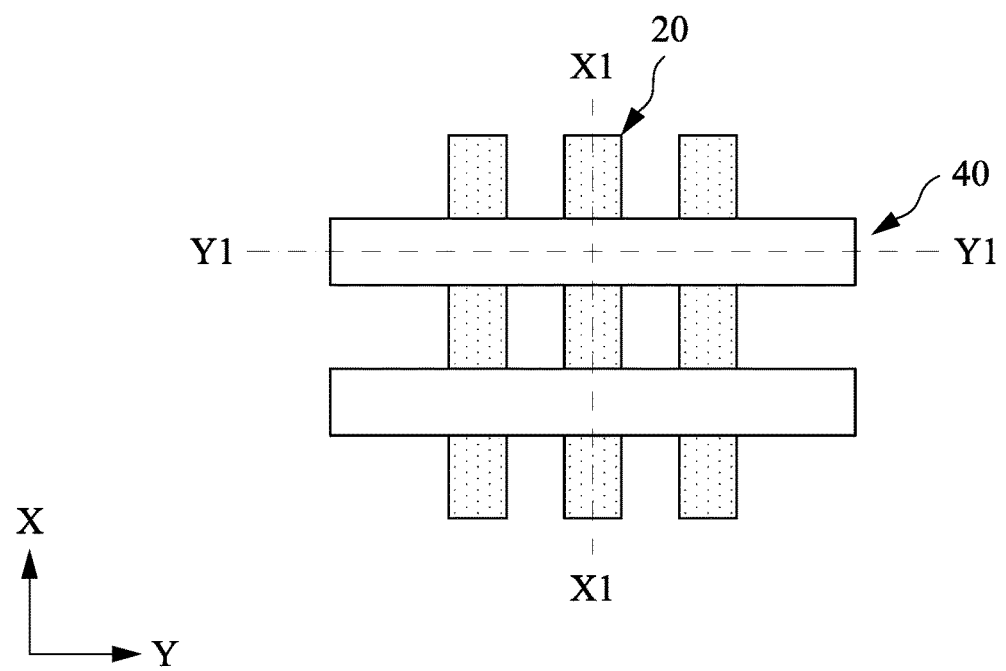
FIGS. 2A, 2B, 2C and 2D show one of the various stages of a sequential manufacturing operation of a semiconductor FET device according to an embodiment of the present disclosure.
Figure 2B:
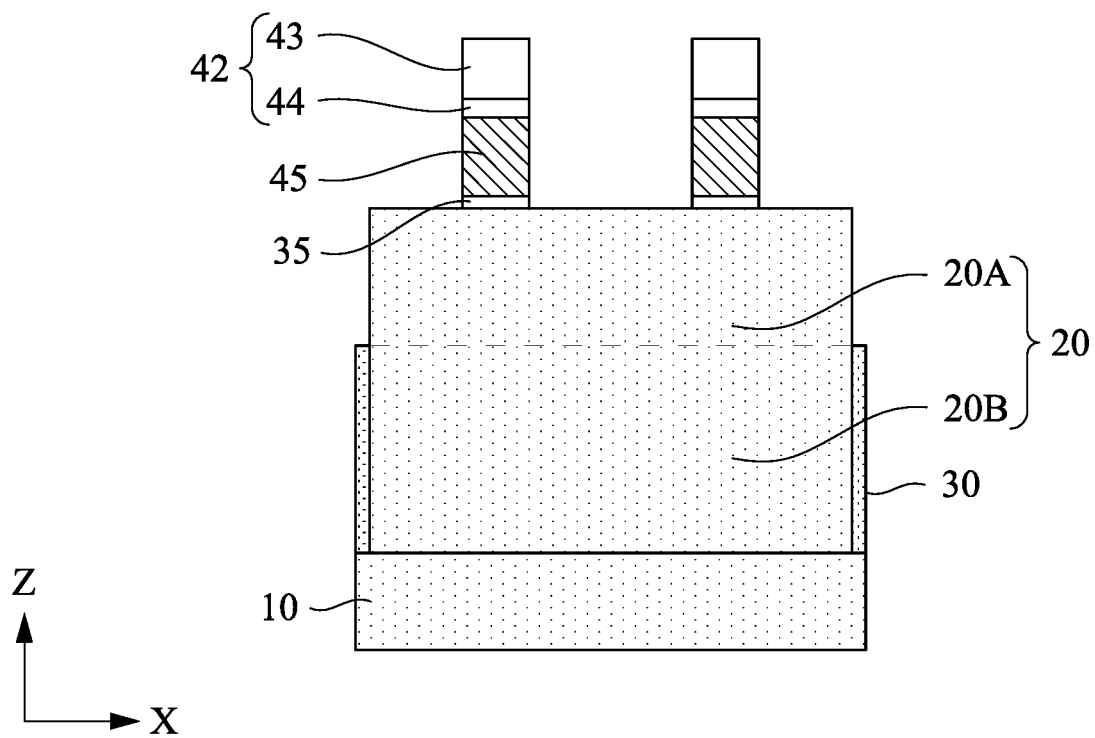
Figure 2C:
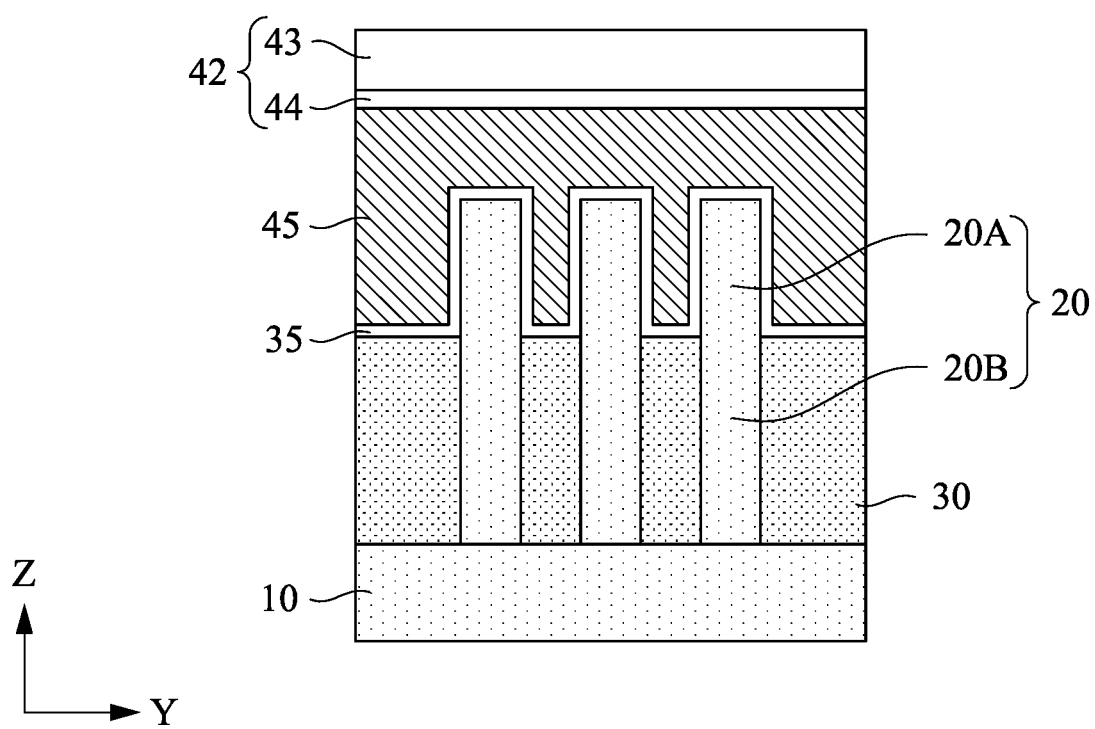
Figure 2D:
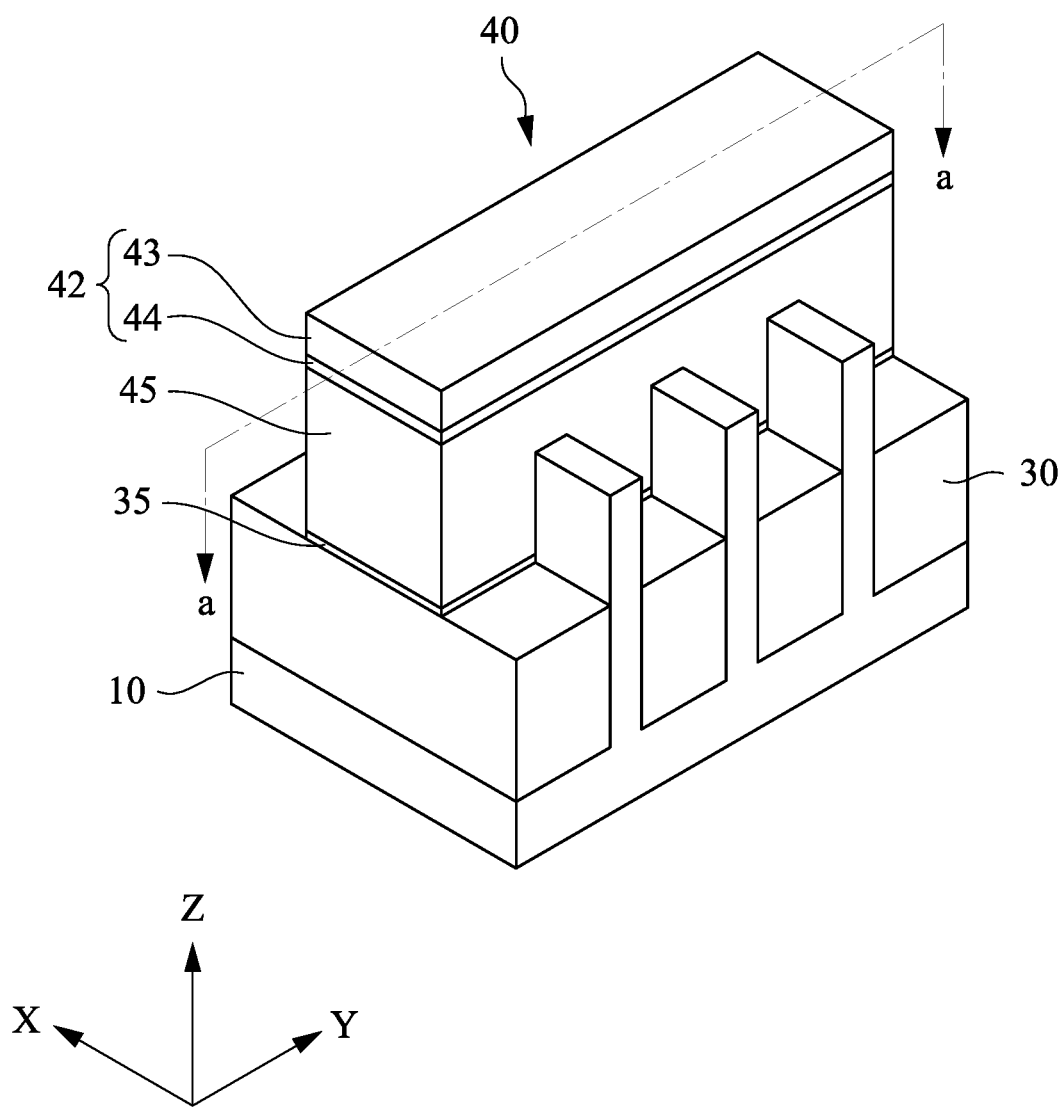

Then, a gate structure 40 is formed over part of the fin structures 20 as shown in FIGS. 2A-2D. FIG. 2A is a plan view (top view), FIG. 2B is a cross sectional view corresponding to X1-X1 of FIG. 2A, FIG. 2C is a cross sectional view corresponding toe Y1-Y1 of FIG. 2A and FIG. 2D is an exemplary perspective view.

A gate dielectric layer and a poly silicon layer are formed over the isolation insulating layer 30 and the exposed fin structures 20, and then patterning operations are performed so as to obtain a gate structure including a gate electrode layer 45 made of, for example, poly silicon and a gate dielectric layer 35. The patterning of the poly silicon layer is performed by using a hard mask 42 including a silicon nitride layer 43 and an oxide layer 44 in some embodiments. In other embodiments, the layer 43 may be silicon oxide and the layer 44 may be silicon nitride. The gate dielectric layer 35 may be silicon oxide formed by CVD, PVD, ALD, e-beam evaporation, or other suitable process. In some embodiments, the gate dielectric layer 35 may include one or more layers of silicon oxide, silicon nitride, silicon oxy-nitride, or high-k dielectrics. In some embodiments, a thickness of the gate dielectric layer is in a range of about 1 nm to about 5 nm. In some embodiments, the gate dielectric layer 35 may include an interfacial layer made of silicon dioxide.

In some embodiments, the gate electrode layer 45 may comprise a single layer or multilayer structure. The gate electrode layer 45 may be doped poly-silicon with uniform or non-uniform doping. In the present embodiment, the width of the gate electrode layer 45 is in the range of about 30 nm to about 60 nm. In some embodiments, a thickness of the gate electrode layer is in a range of about 30 nm to about 50 nm.

As shown in FIG. 2A, two gate structures 40 extending in the Y direction are disposed adjacent to each other in the X direction. However, the number of the gate structures is not limited to two. The numbers may be one, three, four or five or more. In addition, one of more dummy gate structures may be disposed adjacent to both sides of the gate structures 40 to improve pattern fidelity in patterning processes. The width of the gate structure 40 is in a range of about 5 nm to about 40 nm in some embodiments, and may be in a range of about 7 nm to about 15 nm in certain embodiments. In some embodiments, the gate structures 40 are sacrificial gate structures in a gate replacement technology.

Figure 3A:
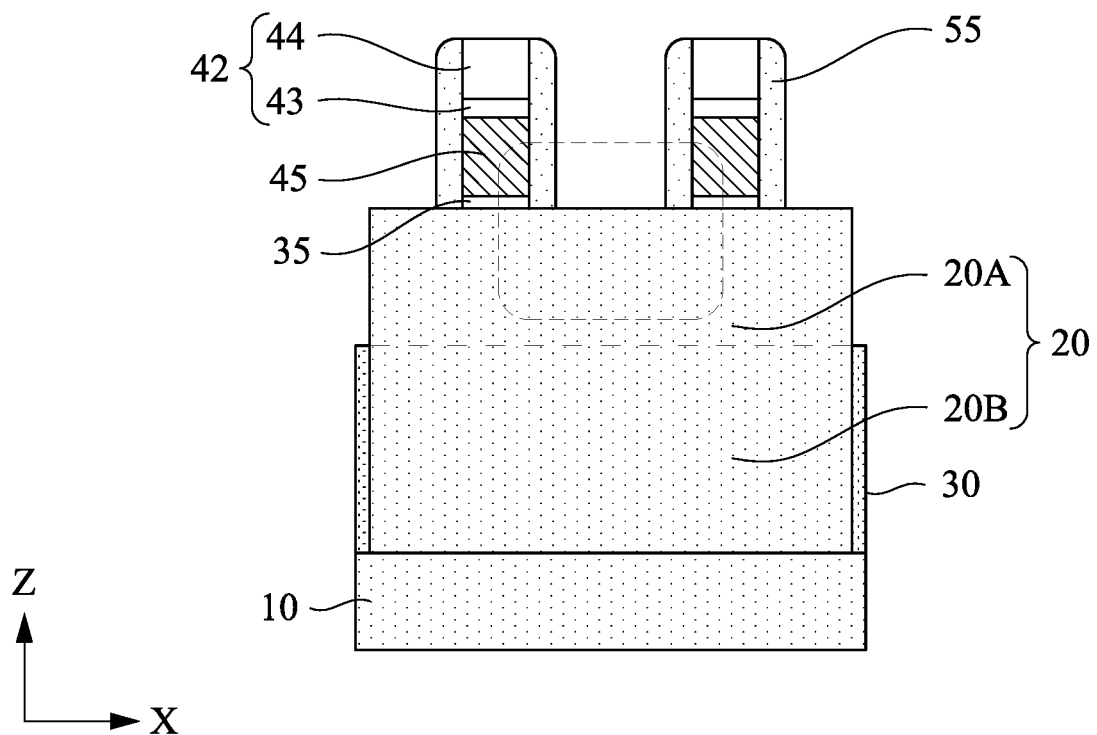
FIGS. 3A and 3B show one of the various stages of a sequential manufacturing operation of a semiconductor FET device according to an embodiment of the present disclosure.
Figure 3B:
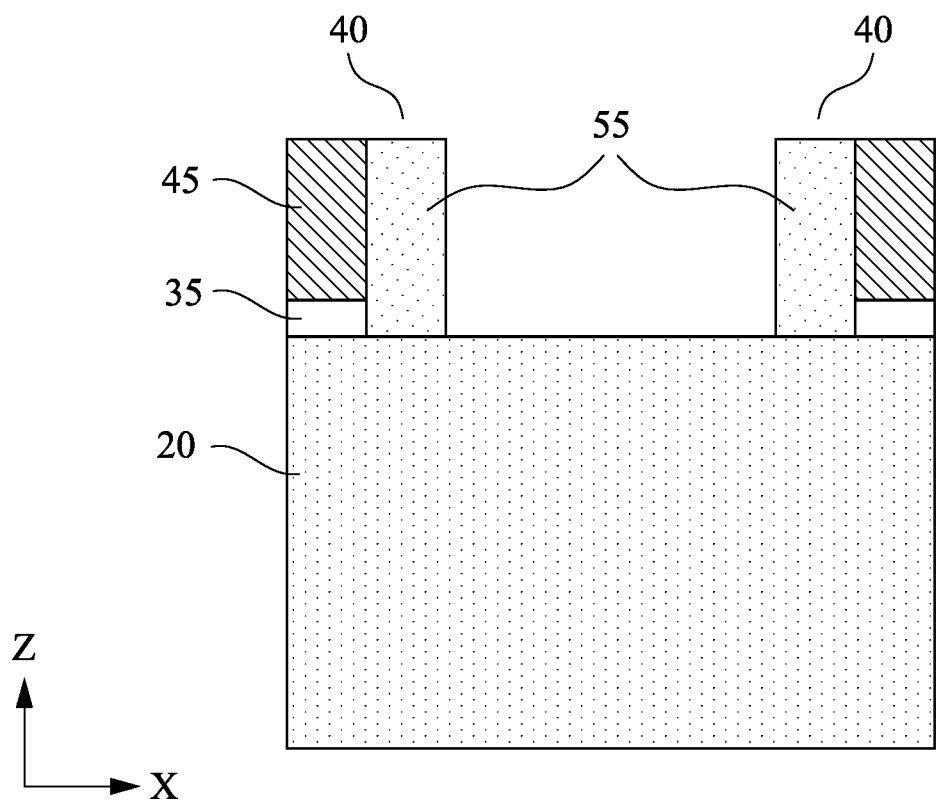

Further, as shown in FIGS. 3A and 3B, sidewall spacers 55 are formed on opposite side faces of the gate structures 40. FIG. 3B is an enlarged view of a source/drain region of FIG. 3A. An insulating material layer for sidewall spacers 55 is formed over the gate structure 40. The insulating material layer is deposited in a conformal manner so that it is formed to have substantially equal thicknesses on vertical surfaces, such as the sidewalls, horizontal surfaces, and the top of the gate structure 40, respectively. In some embodiments, the insulating material layer has a thickness in a range from about 5 nm to about 20 nm. The insulating material layer includes one or more of SiN, SiON and SiCN or any other suitable dielectric material. The insulating material layer can be formed by ALD or CVD, or any other suitable method. Next, as shown in FIGS. 3A and 3B, bottom portions of the insulating material layer are removed by anisotropic etching, thereby forming sidewall spacers 55. In some embodiments, the sidewall spacers 55 include two to four layers of different insulating materials.

Figure 4A:
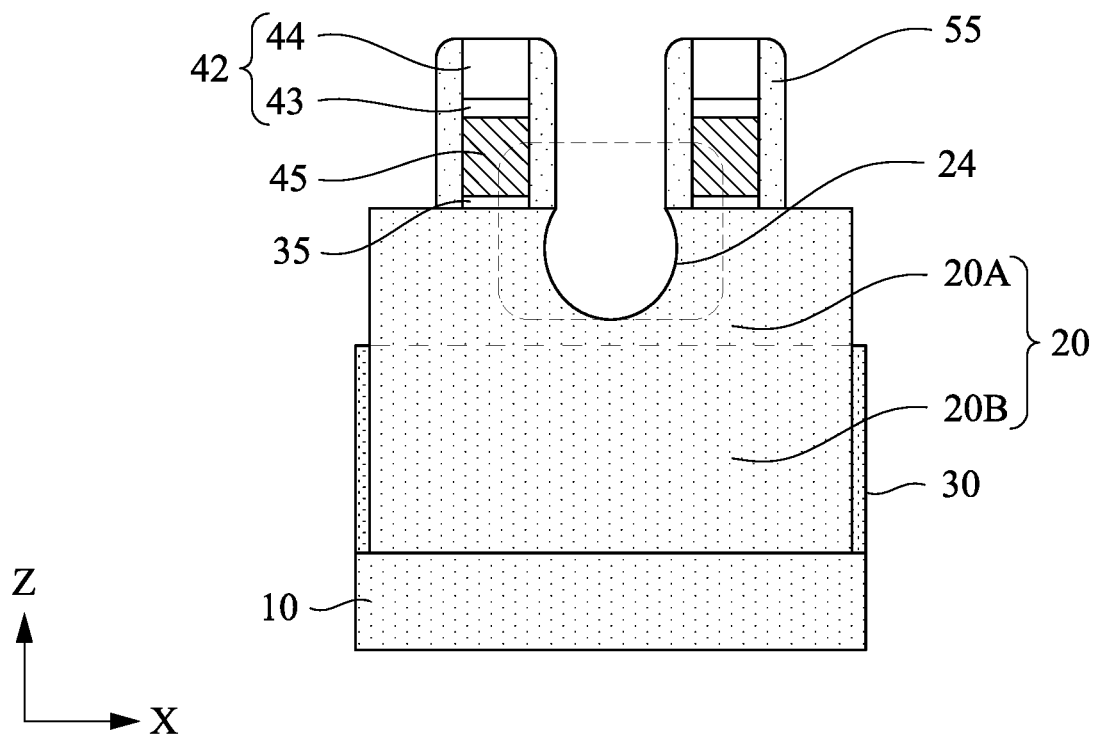
FIGS. 4A and 4B show one of the various stages of a sequential manufacturing operation of a semiconductor FET device according to an embodiment of the present disclosure.
Figure 4B:
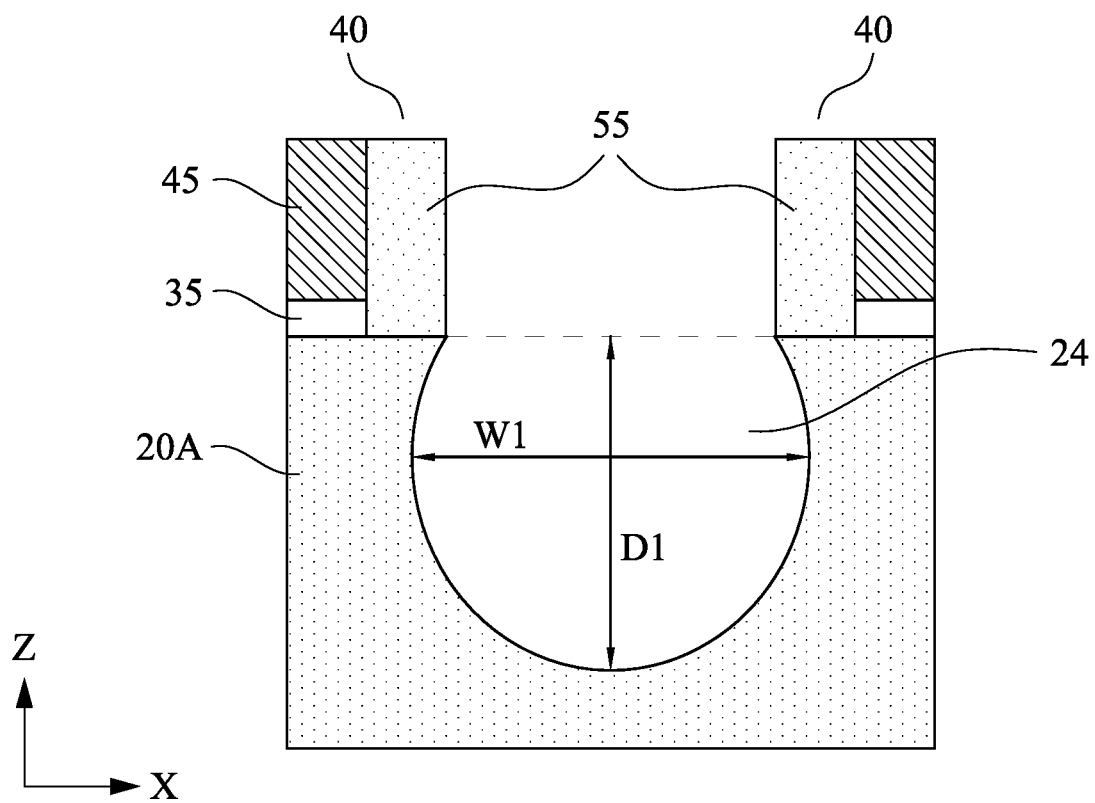

Subsequently, as shown in FIGS. 4A and 4B, a source/drain region of the fin structure 20 not covered by the gate structure 40 is etched down (recessed) to form a source/drain recess 24. FIG. 4B is an enlarged view of a source/drain region of FIG. 4A. As shown in FIGS. 4A and 4B, the cross sectional shape in the Z-X plane of the source/drain recess 24 has a rounded shape in some embodiments. In some embodiments, the depth D1 of the recess 24 measured from the top of the fin structure 20A is in a range from about 25 nm to about 90 nm in some embodiments, and is in a range from about 40 nm to about 50 nm in other embodiments.

The etching operations to form the "octagonal" source/drain recess 25 are as follows. In some embodiment, the "octagonal" refers to a shape defined by seven connected lines as shown in FIG. 5B. In some embodiments, the adjacent lines form an angle of about 135 degrees (e.g., 130-140 degrees). First, the source/drain region of the fin structure 20 is recessed by plasma dry etching. In some embodiments, the plasmas dry etching is isotropic etching. The etching conditions in the recess etching process are adjusted to achieve a desired etching profile. In some embodiments, RF plasma, transformer coupled plasma (TCP) or inductively coupled plasma (ICP) with process gases including $CH_4$, $CHF_3$, $O_2$, HBr, He, $Cl_2$, $NF_3$, and/or $N_2$ is used with changing power and/or bias conditions. Then, in some embodiments, a cleaning operation is performed to remove surface native oxide of the source/drain region of the fin structure 20. In some embodiments, RF plasma using a mixed gas of $NH_3$, $NF_3$, He and $H_2$ is utilized. The cleaning operation is omitted in other embodiments. In other embodiments, the source/drain recess 25 has at least one straight sidewall embedded in the fin structure, and in certain embodiments, the source/drain recess 25 has two straight sidewalls embedded in the fin structure.

Figure 5A:
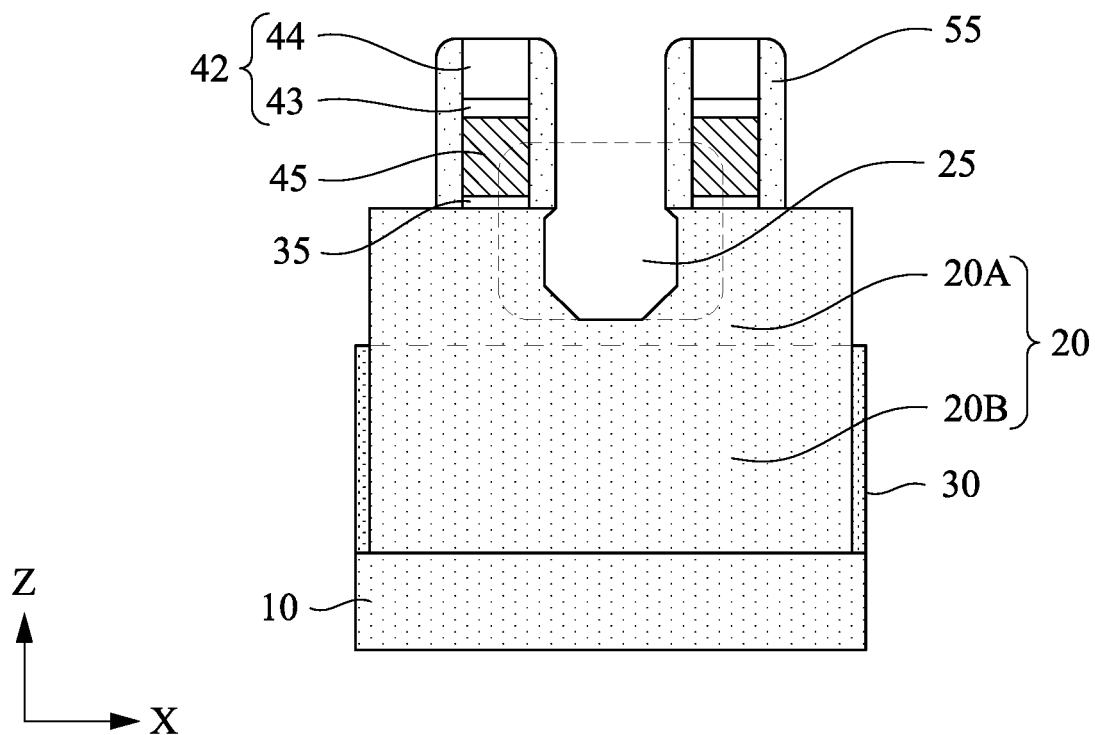
FIGS. 5A and 5B show one of the various stages of a sequential manufacturing operation of a semiconductor FET device according to an embodiment of the present disclosure.
Figure 5B:
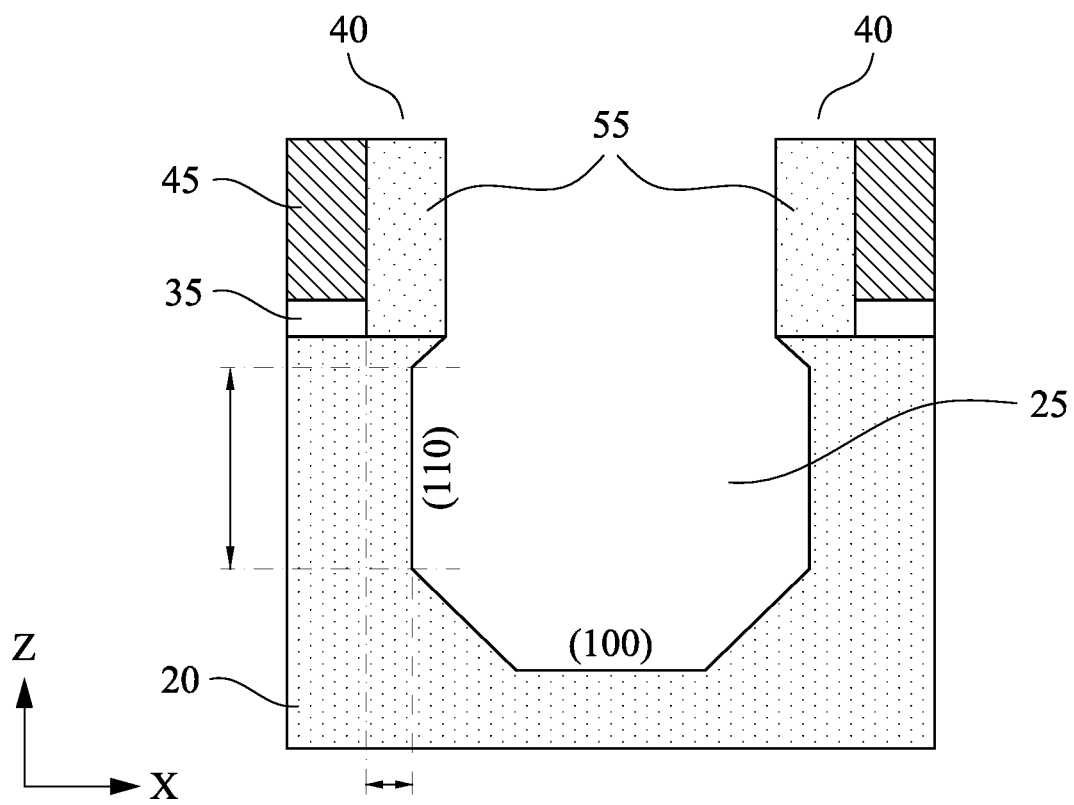

Then, the source/drain recess 24 of the fin structure 20 is treated to form the octagonal shape, as shown in FIGS. 5A and 5B. The treated recess 25 has an octagonal shape having seven surfaces. In some embodiments, the bottom of the source/drain recess 25 is the (100) surface of silicon (or SiGe or Ge), and the sides of the source/drain recess 25 are the (110) surface of silicon.

The treatment is a chemical etching in some embodiments. The treatment is performed using a mixed gas of $SiH_4$, HCl and $H_2$ in some embodiments. No plasma assistance is used in some embodiments. $SiH_4$ is used as a surface repairing and shaping gas and HCl is used as a contamination removal gas in some embodiments. $H_2$ is carrier gas in some embodiments. The substrate is heated at a temperature in a range from about 300° C. to about 900° C. in some embodiments. In certain embodiments, the temperature is in a range from about 600° C. to about 800° C. The treatment is performed under a pressure in a range from about 1 Torr to about 500 Torr in some embodiments, and in other embodiments, the pressure is in a range from about 5 Torr to about 50 Torr. The treatment time is about 60 sec to about 120 sec in some embodiments.

To obtain the octagonal shape, an etching ratio (110)/(100) is controlled by adjusting the treatment parameters, such as the temperature, the pressure, and gas flow amounts. In some embodiments, the etching ratio (110)/(100) is in a range from about 5 to about 10, and is in a range from about 6 to 8 in other embodiments. In addition, by adjusting the treatment parameters, it is possible to control the surface roughness (RMS) of the (110) and (100) surfaces in the source/drain recess 24.

In other embodiments, the surface repairing and shaping gas includes a Si based gas, such as silicon hydride ($Si_xH_y$), silicon-carbide-hydride ($Si_xC_yH_z$), and or silicon hydride-halide ($Si_xH_yCl_z$ or $Si_xH_yF_z$). For example, the surface repairing and shaping gas includes $SiH_4$, $Si_2H_6$, $SiCH_6$, $SiH_yCl_z$ (y+z=4), $Si_2H_yCl_z$ (y+z=6), $SiH_yF_z$ (y+z=4), and/or $Si_2H_yF_z$ (y+z=6) in some embodiments. In other embodiments, Ge based gas, such as germanium hydride ($GH_4$, $GH_2H_6$), germanium hydride-halide, is used. When the fin structure 20 is made of SiGe, a mixture of Si based gas and Ge based gas is used. The contamination removal gas includes $H_xCl_y$, $NH_x$, $NF_x$, $NH_xCl_y$, $CF_x$, $CH_xF_y$, and/or $H_xF_y$. For example, the contamination removal gas includes HCl, $NH_3$, $NF_3$, $NH_2Cl$, $CF_4$, $CH_3F$, $CHF_3$ and/or HF. The carrier gas includes $N_2$, $H_2$, Ar, and/or He.

In some embodiments, the (110) surface is located just below the sidewall spacer 55. In some embodiments, the (110) surface is located closer to the channel (just below the gate) than the center of the sidewall spacer 55.

Figure 6A:
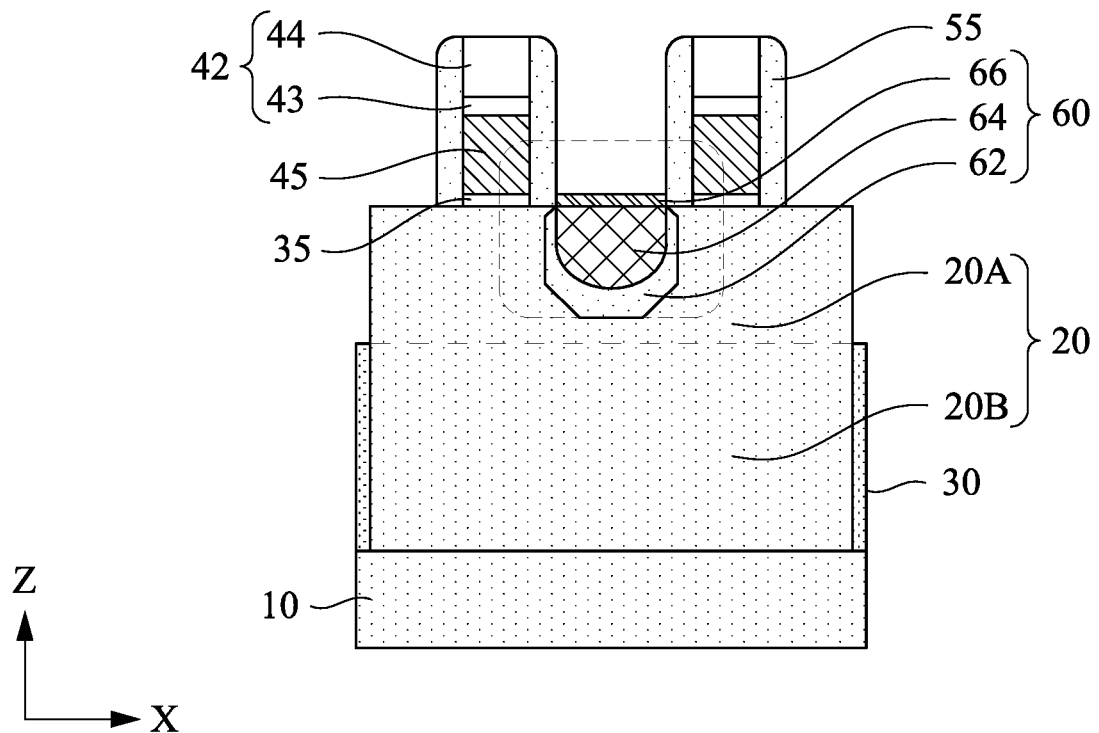
FIGS. 6A and 6B show one of the various stages of a sequential manufacturing operation of a semiconductor FET device according to an embodiment of the present disclosure.
Figure 6B:
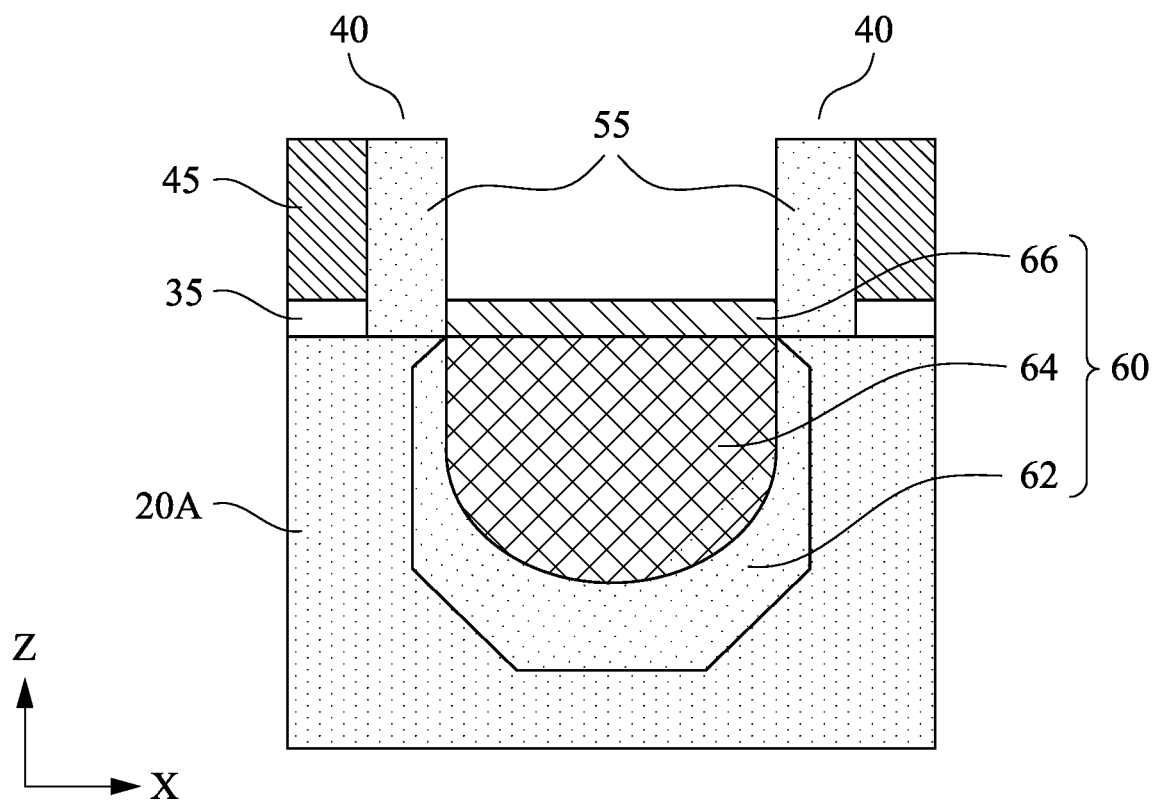

After the octagonal source/drain recess 25 is formed, one or more source/drain epitaxial layers 60 are formed in the source/drain recess 25, as shown in FIGS. 6A and 6B. In some embodiments, a first epitaxial layer 62, a second epitaxial layer 64 and a third epitaxial layer 66 are formed. In other embodiments, no third epitaxial layer is formed.

The first epitaxial layer 62 is formed over the bottom of the source/drain recess 25. The first epitaxial layer 62 functions as a channel stressor for applying tensile stress to the channel layer 20A. The first epitaxial layer 62 includes SiP or SiCP for an n-type FinFET, and SiGe doped with B for a p-type FinFET, in the some embodiments. An amount of P (phosphorus) in the first epitaxial layer is in a range from about $1 \times 10^{18}$ atoms/cm$^3$ to about $1 \times 10^{20}$ atoms/cm$^3$, in some embodiments. The thickness of the first epitaxial layer 62 is in a range of about 5 nm to 20 nm in some embodiments, and in a range of about 5 nm to about 15 nm in other embodiments.

When the first epitaxial layer 62 is SiGe, an amount of Ge is about 25 atomic % to about 32 atomic % in some embodiments, and is about 28 atomic % to about 30 atomic % in other embodiments.

After forming the first epitaxial layer 62, a second epitaxial layer 64 is formed over the first epitaxial layer 62. The second epitaxial layer 64 functions as a main channel stressor for applying tensile stress to the channel layer 20A. The second epitaxial layer 64 includes SiP or SiCP for an n-type FinFET, and SiGe doped with B for a p-type FinFET, in some embodiments. In some embodiments, an amount of phosphorus in the second epitaxial layer 64 is higher than the phosphorus amount of the first epitaxial layer 62 and is in a range about $1 \times 10^{20}$ atoms/cm$^3$ to about $2 \times 10^{20}$ atoms/cm$^3$. The thickness of the second epitaxial layer 64 is in a range of about 20 nm to 40 nm in this embodiment, or in a range of about 25 nm to about 35 nm in other embodiments.

When the second epitaxial layer 64 is SiGe, an amount of Ge is about 40 atomic % to about 50 atomic % in some embodiments, and is about 41 atomic % to about 46 atomic % in other embodiments.

After forming the second epitaxial layer 64, a third epitaxial layer 66 may be formed over the second epitaxial layer 64. The third epitaxial layer 66 may include a SiP epitaxial layer. The third epitaxial layer 66 is a sacrificial layer for silicide formation in the source/drain. An amount of phosphorus in the third epitaxial layer 66 is less than the phosphorus amount of the second epitaxial layer 66 and is in a range of about $1 \times 10^{18}$ atoms/cm$^3$ to about $1 \times 10^{20}$ atoms/cm$^3$ in some embodiments.

When the third epitaxial layer 66 is SiGe, an amount of Ge is less than about 20 atomic % in some embodiments, and is about 1 atomic % to about 18 atomic % in other embodiments.

In at least one embodiment, the epitaxial layers 62, 64 and 66 are epitaxially-grown by an LPCVD process, molecular beam epitaxy, atomic layer deposition or any other suitable method. The LPCVD process is performed at a temperature of about 400 to 800° C. and under a pressure of about 1 to 200 Torr, using silicon source gas such as $SiH_4$, $Si_2H_6$, or $Si_3H_8$; germanium source gas such as $GeH_4$, or $G_2H_6$; carbon source gas such as $CH_4$ or $SiH_3CH$ and phosphorus source gas such as $PH_3$.

Figure 7:
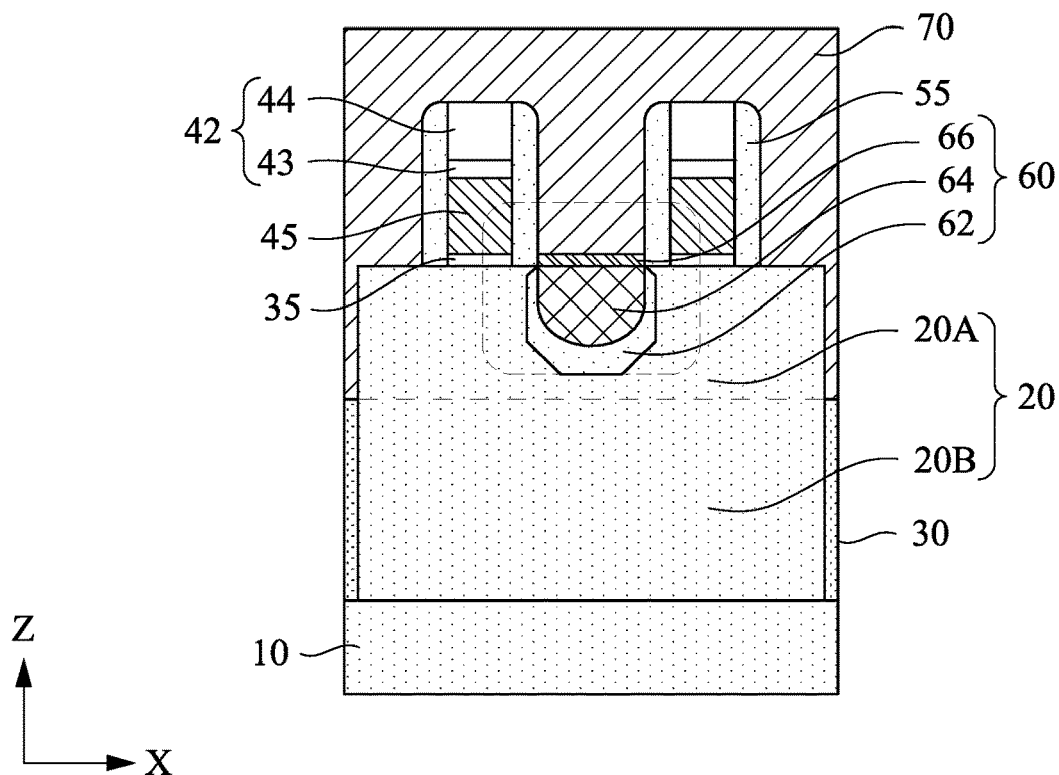
FIG. 7 shows one of the various stages of a sequential manufacturing operation of a semiconductor FET device according to an embodiment of the present disclosure.

Then, as shown in FIG. 7, an interlayer dielectric (ILD) layer 70 is formed over the S/D epitaxial layer 60 and the sacrificial gate structure 40. The materials for the ILD layer 70 include compounds comprising Si, O, C and/or H, such as silicon oxide, SiCOH and SiOC. Organic materials, such as polymers, may be used for the ILD layer 70.

Figure 8:
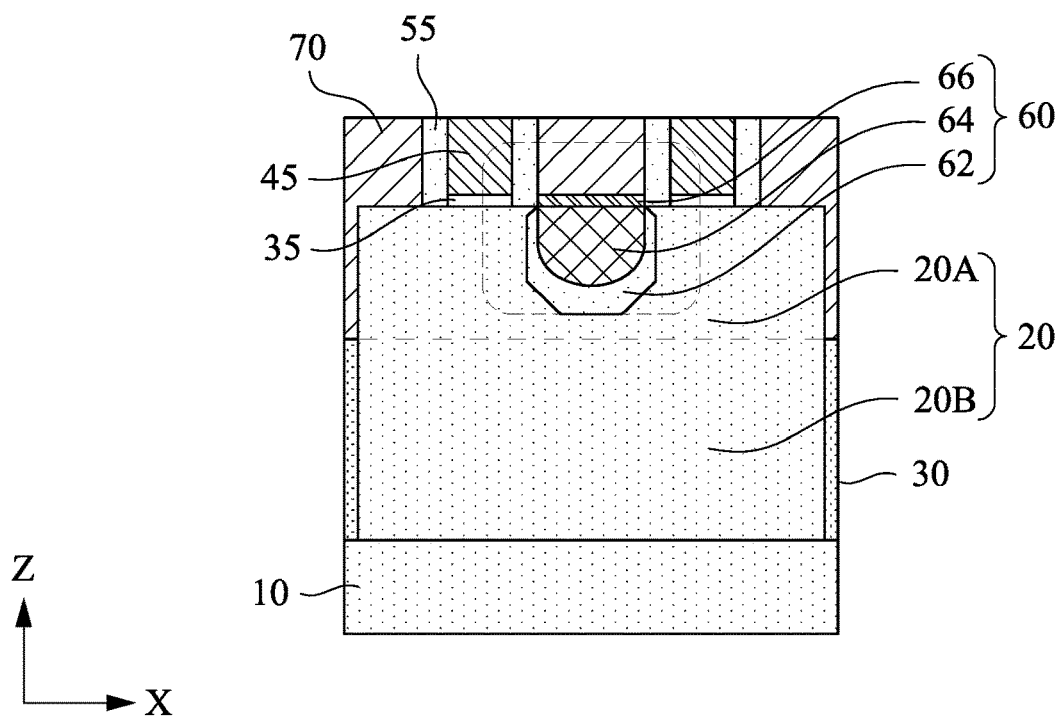
FIG. 8 shows one of the various stages of a sequential manufacturing operation of a semiconductor FET device according to an embodiment of the present disclosure.

After the ILD layer 70 is formed, a planarization operation, such as CMP, is performed, so that the top portion of the sacrificial gate electrode layer 45 is exposed, as shown in FIG. 8. In some embodiments, before the ILD layer 70 is formed, a contact etch stop layer, such as a silicon nitride layer or a silicon oxynitride layer, is formed.

Figure 9:
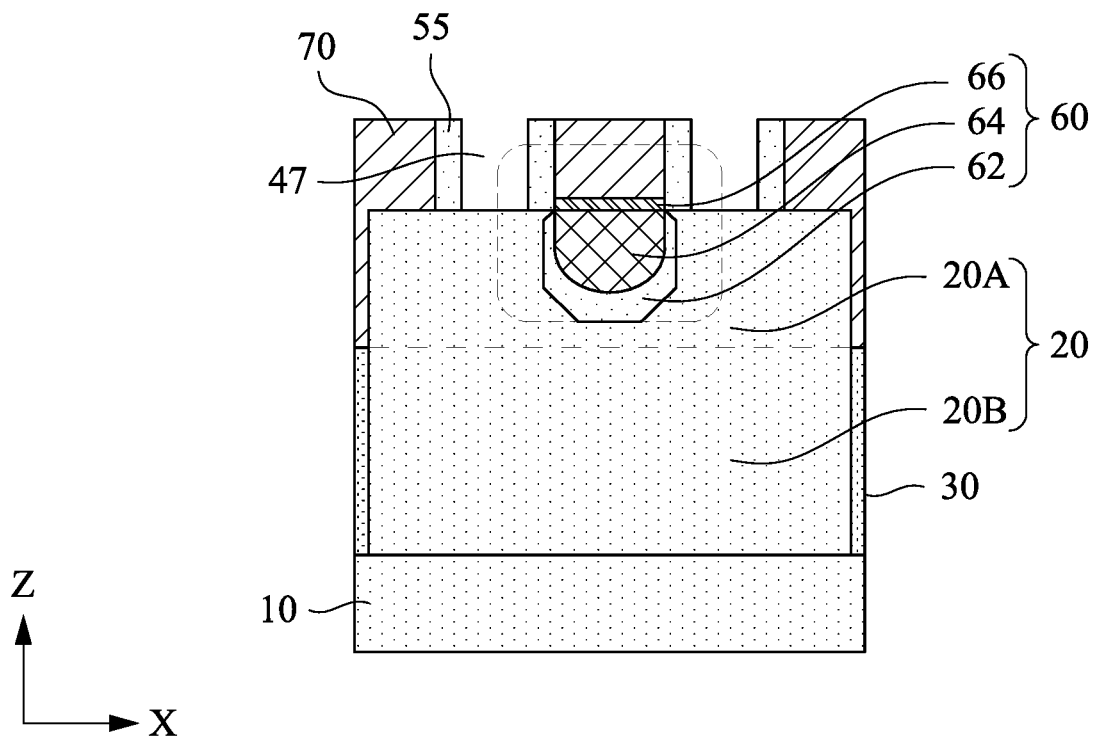
FIG. 9 shows one of the various stages of a sequential manufacturing operation of a semiconductor FET device according to an embodiment of the present disclosure.

Then, the sacrificial gate electrode layer 45 and the sacrificial gate dielectric layer 35 are removed, thereby forming a gate space 47 as shown in FIG. 9. The sacrificial gate structures can be removed using plasma dry etching and/or wet etching. When the sacrificial gate electrode layer 45 is polysilicon and the ILD layer 70 is silicon oxide, a wet etchant such as a TMAH solution can be used to selectively remove the sacrificial gate electrode layer 45. The sacrificial gate dielectric layer 35 is thereafter removed using plasma dry etching and/or wet etching as shown in FIG. 9.

Figure 10:
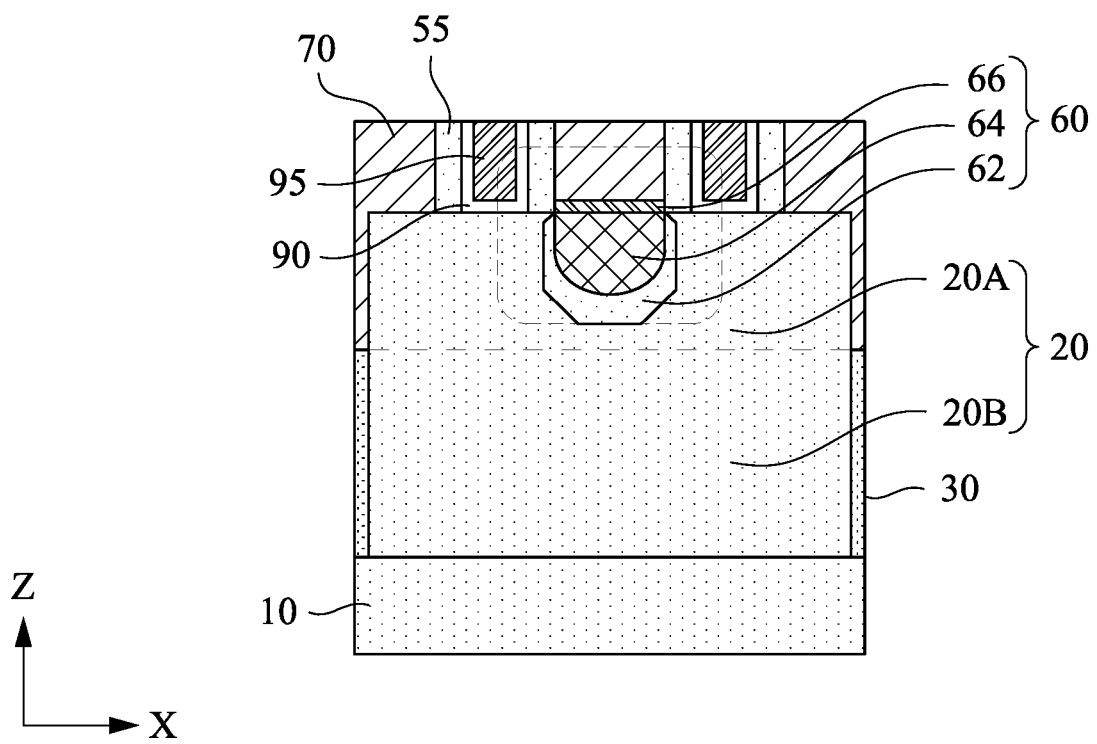
FIG. 10 shows one of the various stages of a sequential manufacturing operation of is a semiconductor FET device according to an embodiment of the present disclosure.

After the sacrificial gate electrode layer 45 and the sacrificial gate dielectric layer 35 are removed, a gate dielectric layer 90 and a gate electrode 95 are formed in the gate space 47, as shown in FIG. 10. In some embodiments, the gate dielectric layer 90 includes one or more layers of a dielectric material, such as silicon oxide, silicon nitride, or a high-k dielectric material, other suitable dielectric material, and/or combinations thereof. Examples of high-k dielectric materials include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. In some embodiments, the gate dielectric layer 90 includes an interfacial layer formed between the channel layer and the dielectric material, by using chemical oxidation. The gate dielectric layer 90 may be formed by CVD, ALD or any suitable method. In one embodiment, the gate dielectric layer 90 is formed using a highly conformal deposition process such as ALD in order to ensure the formation of a gate dielectric layer having a uniform thickness around each channel layer. The thickness of the gate dielectric layer 90 is in a range from about 1 nm to about 10 nm in one embodiment.

Subsequently, a gate electrode layer 95 is formed on the gate dielectric layer 90. The gate electrode layer 95 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode layer 95 may be formed by CVD, ALD, electro-plating, or other suitable method. The metals for the gate dielectric layer 90 and the gate electrode layer 95 are also deposited over the upper surface of the first ILD layer 70. The material for the gate electrode layer formed over the ILD layer 70 is then planarized by using, for example, CMP, until the top surface of the ILD layer 70 is revealed.

In certain embodiments of the present disclosure, one or more work function adjustment layers (not shown) are interposed between the gate dielectric layer 90 and the gate electrode layer 95. The work function adjustment layers are made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function adjustment layer, and for the p-channel FET, one or more of TiAlC, Al, TiAl, TaN, TaAlC, TiN, TiC and Co is used as the work function adjustment layer. The work function adjustment layer may be formed by ALD, PVD, CVD, e-beam evaporation, or other suitable process. Further, the work function adjustment layer may be formed separately for the n-channel FET and the p-channel FET which may use different metal layers.

In some embodiments, after the planarization operation, the metal gate electrode layer 95 is recessed and a cap insulating layer (not shown) is formed over the recessed gate electrode layer. The cap insulating layer includes one or more layers of a silicon nitride-based material, such as SiN. The cap insulating layer can be formed by depositing an insulating material followed by a planarization operation.

It is understood that the FET undergoes further CMOS processes to form various features such as contacts/vias, interconnect metal layers, dielectric layers, passivation layers, etc.

FIGS. 11A-11G show views of various stages of a sequential manufacturing operation of a semiconductor device according to the present disclosure. It is understood that additional operations may be provided before, during, and after processes shown by FIGS. 11A-11G, and some of the operations described below can be replaced or eliminated for additional embodiments of the method. The order of the operations/processes may be interchangeable. Material, configuration, dimensions and/or processes the same as or similar to the foregoing embodiments described with respect to FIGS. 1-10 may be employed in the embodiment of FIGS. 11A-11G, and detailed explanation thereof may be omitted.

Figure 11A:
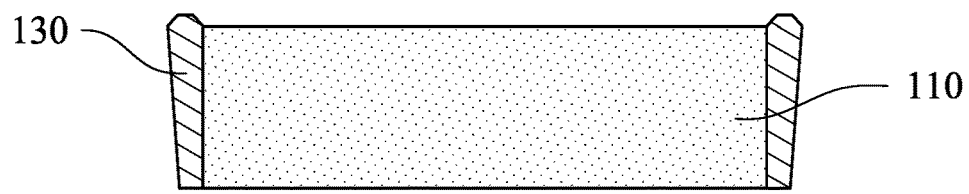
FIGS. 11A, 11B, 11C, 11D, 11E, 11F and 11G show various stages of a sequential manufacturing operation of is a semiconductor FET device according to another embodiment of the present disclosure.

As shown in FIG. 11A, isolation insulating layers 130 (e.g., STI) are formed in the surface region of a semiconductor substrate 110. In some embodiments, the substrate 110 is a silicon substrate having (100) orientation.

Figure 11B:

Then, as shown in FIG. 11B, active areas surrounded by the isolation insulating layers 130 are recessed by one or more etching operations.

Figure 11C:
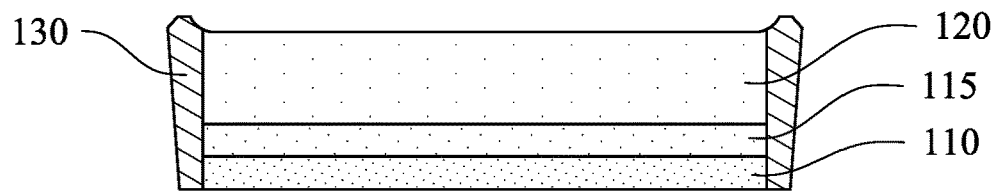

Next, as shown in FIG. 11C, a channel semiconductor layer 120 is epitaxially formed in the recessed portion. In some embodiments, the channel semiconductor layer 120 includes Si, SiGe and/or Ge. In certain embodiments, a buffer layer is interposed between the substrate 110 and the channel semiconductor layer 120. In some embodiments, a well layer 115 is formed at a bottom of the channel semiconductor layer 120.

Figure 11D:
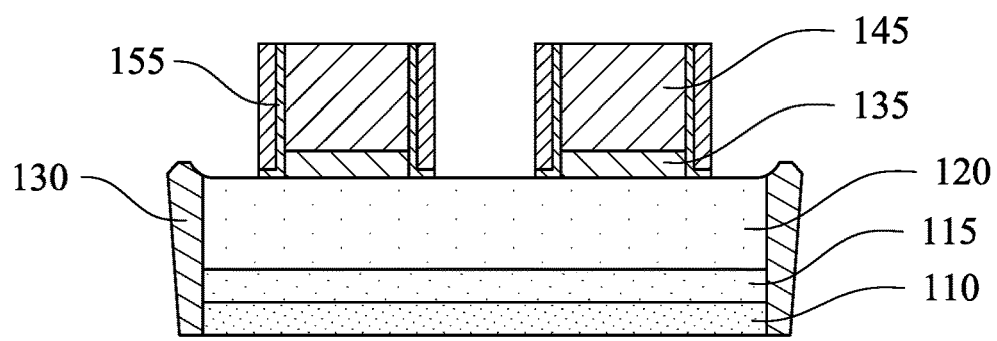

Then, as shown in FIG. 11D, gate structures each having a gate dielectric layer 135 and a gate electrode layer 145 are formed and sidewall spacers 155 are further formed on opposite side faces of the gate structures, similar to FIGS. 2A-3B. In some embodiments, the sidewall spacers 155 include one or more layers.

Figure 11E:
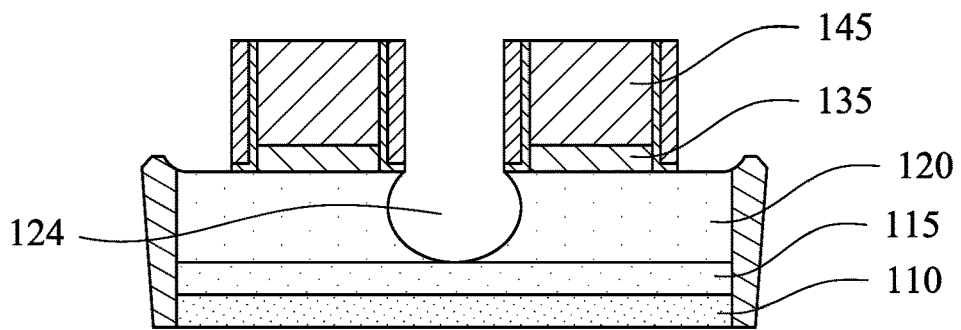

Subsequently, as shown in FIG. 11E, a source/drain region of semiconductor layer 120, not covered by the gate structures, is etched down (recessed) to form a source/drain recess 124, similar to FIGS. 4A and 4B.

Figure 11F:
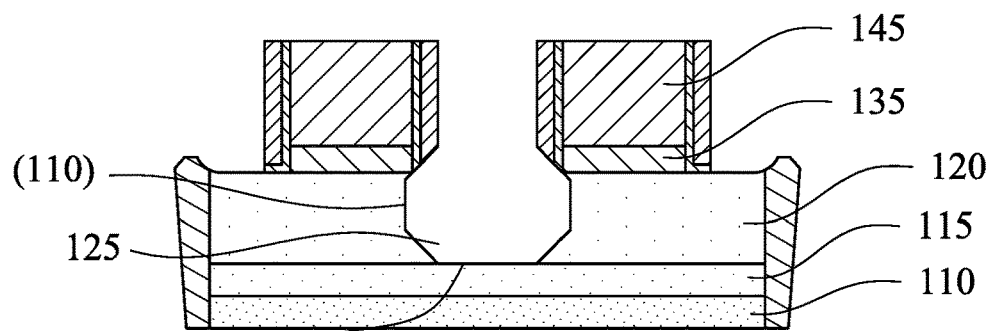

Then, as shown in FIG. 11F, the source/drain recess 124 is treated to form the octagonal shaped recess 125, similar to FIGS. 5A and 5B. The treated recess 25 has an octagonal shape having seven surfaces. In some embodiments, the bottom of the source/drain recess 25 is the (100) surface of silicon (or SiGe or Ge), and the sides of the source/drain recess 25 are the (110) surface of silicon.

Figure 11G:
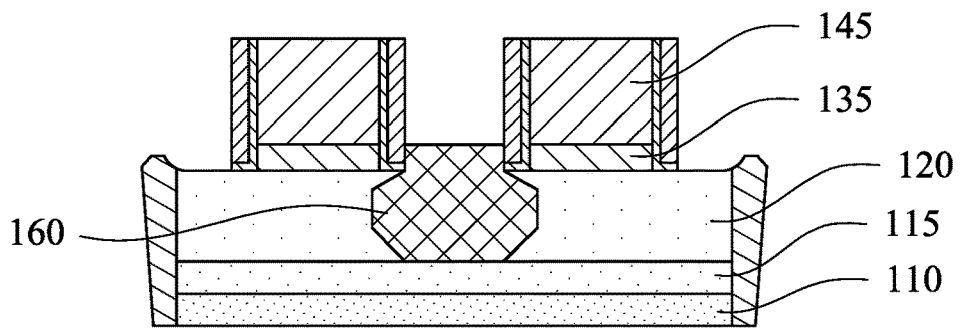

Further, as shown in FIG. 11G, one or more source/drain epitaxial layers 160 are formed in the octagonal recess 125, similar to FIGS. 6A and 6B.

Figure 12A:
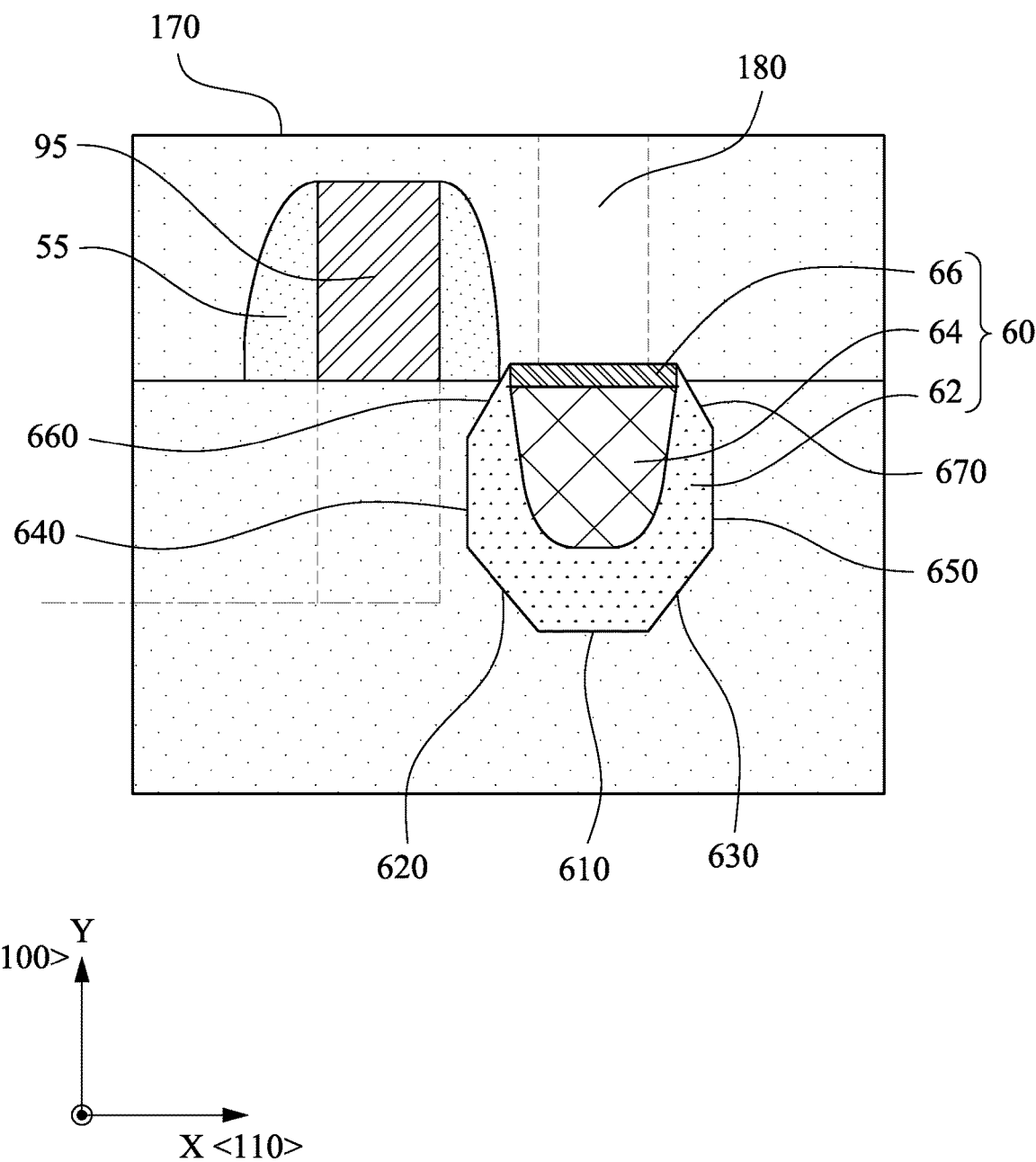
FIG. 12A shows a cross sectional view of a semiconductor FET according to one embodiment of the present disclosure.

FIG. 12A shows a cross sectional view after an interlayer dielectric (ILD) layer 170 and a source/drain contact 180 is formed over the third epitaxial layer 66. The source/drain epitaxial layer 60 has an octagonal shape having a bottom face 610, two lower oblique faces 620 and 630, two middle faces 640 and 650 and two upper oblique faces 660 and 670.

Figure 12B:
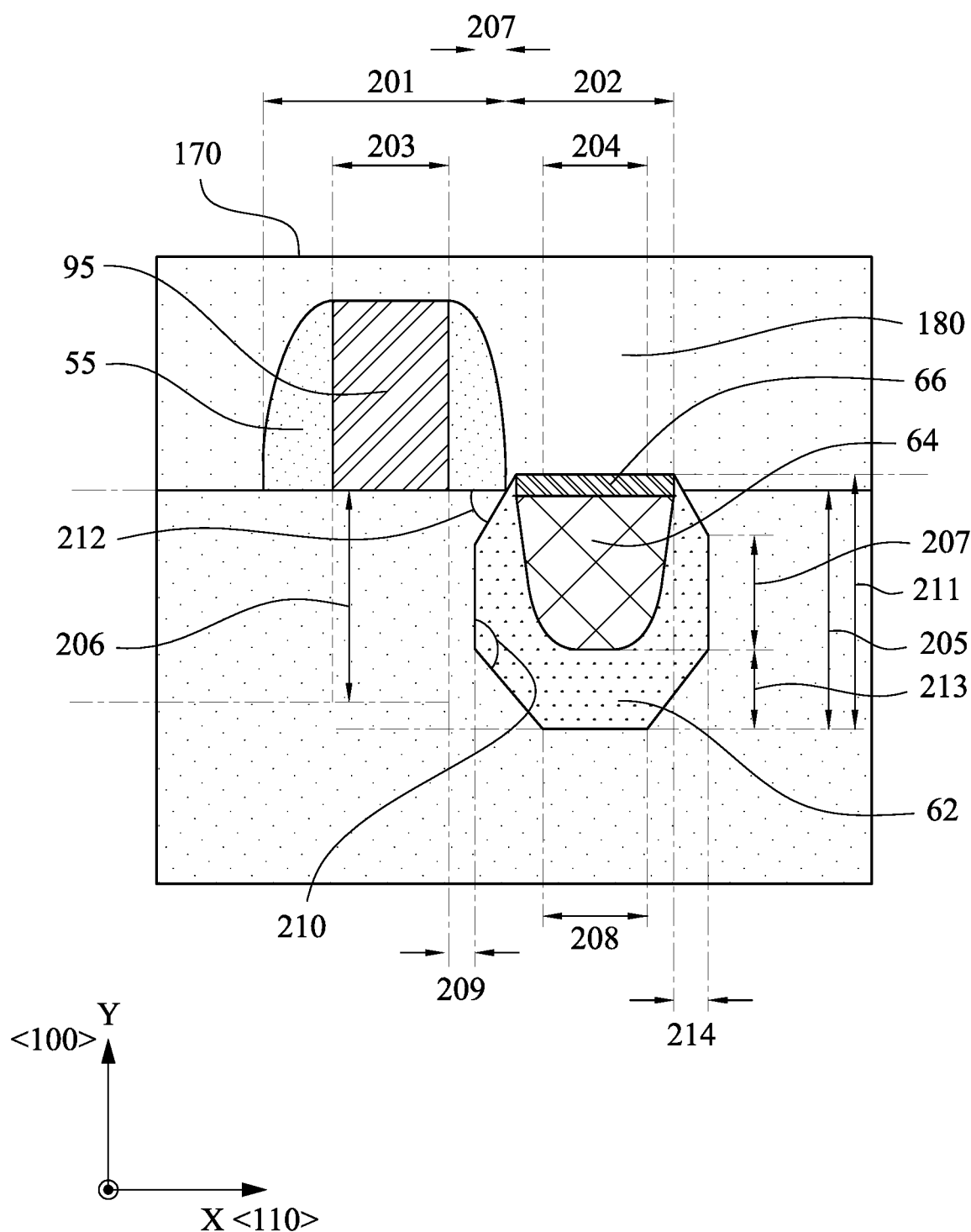
FIG. 12B shows various dimensions and parameters of a semiconductor FET according to one embodiment of the present disclosure.

FIG. 12B shows various dimensions or parameters of a semiconductor device according to an embodiment of the present disclosure. In some embodiments, a width 203 of the metal gate electrode 95 is in a range from about 5 nm to about 45 nm. In some embodiments, a total width 201 of the sidewall spacers 55 and the gate electrode 95 is in a range from about 15 nm to about 95 nm. In some embodiments, the width 201 is greater than a width 202 of an opening of the source/drain epitaxial layer 60. The width 202 is in a range from about 25 nm to about 35 nm in some embodiments. A width of the fin structure 20 is in a range from about 15 nm to about 25 nm in some embodiments. A width 204 of the source/drain contact 180 at the bottom thereof is in a range from about 10 nm to about 25 nm. In some embodiments, a ratio of the thickness of the side wall spacer 55 (one side) to the width of the gate electrode in the X direction is in a range from about 1 to about 9.

A depth 205 of the source/drain recess 25 is in a range from about 30 nm to about 100 nm in some embodiments, and is in a range from about 46 nm to about 56 nm in other embodiments. A ratio of a depth 206 of the fin structure 20 measured from the top of the fin structure to the level of the upper surface of the isolation insulating layer 30 (corresponds to the length of the channel region 20A) to the depth 205 is in a range from about 0.6 to about 1.0 in some embodiments.

In some embodiments, a length 207 of the (110) face (the middle face 640 and 650) on the octagonal source/drain epitaxial layer is in a range from about 5 nm to about 25 nm, which can improve DIBL, leakage and electric control field. In other embodiments, the length 207 is in a range from about 18 nm to about 22 nm. A width 208 of the bottom face 610 of the source/drain epitaxial layer 60 is in a range from about 15 nm to about 25 nm in some embodiments, and is in a range from about 18 nm to about 22 nm in other embodiments. A distance 209 between the middle face 640 of the source/drain epitaxial layer 60 and the channel region of the fin structure is in a range from about 0.2 nm to about 4 nm in some embodiments and is in a range from about 2.5 nm to about 3.5 nm in other embodiments.

An angle 210 between the middle face 640 (the (110) surface) and the bottom oblique face 620 (the (111) surface) is in a range from about 110° to about 130° in some embodiments. An angle 212 between the surface of the fin structure and the upper oblique face 660 is in a range from about 30° to about 70° in some embodiments.

A thickness 213 of the first epitaxial layer 62 at the bottom of the second epitaxial layer 64 is in a range from about 15 nm to about 30 nm in some embodiments, and is in a range from about 16 nm to about 25 nm in other embodiments. A ratio of the thickness 213 to a total thickness 211 of the source/drain epitaxial layer 60 is in a range from about 0.25 to about 0.45 in some embodiments. The thickness 211 is greater than the depth 205 in some embodiments. A distance 214 between the second epitaxial layer 64 and the middle face 650 is in a range from 10 nm to about 20 nm in some embodiments, and is equal to or smaller than 16 nm in other embodiments. A difference between the thickness of the sidewall spacer 55 and the distance 209 between the source/drain epitaxial layer and the channel region is in a range from about 2 nm to about 25 nm in some embodiments.

It will be understood that not all advantages have been necessarily discussed herein, no particular advantage is required for all embodiments or examples, and other embodiments or examples may offer different advantages.

According to the embodiments of the present disclosure, by employing the octagonal source/drain structure, a distance between the channel to the <110> sidewall of the octagon can be decreased, and <110> sidewall surface roughness can be reduced. Further, the device performance can be improved.

In accordance with one aspect of the present disclosure, a semiconductor device includes a fin structure disposed over a substrate, wherein the fin structure includes a channel layer and extends in a first direction, a gate structure including a gate electrode layer and a gate dielectric layer, sidewall spacers disposed on opposite side faces of the gate structure, sidewall spacers disposed on opposite sides of the gate structure, and a source/drain structure including an epitaxial layer having at least seven facets in a cross section along the first direction. In one or more of the foregoing or the following embodiments, one of the seven faces is a (110) face. In one or more of the foregoing or the following embodiments, the (110) face is parallel to a side face of the gate electrode. In one or more of the foregoing or the following embodiments, two of the seven faces are (110) faces. In one or more of the foregoing or the following embodiments, one of the seven faces is a (100) face. In one or more of the foregoing or the following embodiments, the (100) face is a bottom face. In one or more of the foregoing or the following embodiments, a length of the (110) face is at least 5 nm. In one or more of the foregoing or the following embodiments, the epitaxial layer includes a first epitaxial layer and a second epitaxial layer disposed on the first epitaxial layer. In one or more of the foregoing or the following embodiments, the first epitaxial layer includes SiP, the second epitaxial layer includes SiP, and a concentration of P in the first epitaxial layer is greater than a concentration of P in the second epitaxial layer. In one or more of the foregoing or the following embodiments, the first epitaxial layer includes SiGe, the second epitaxial layer includes SiGe, and an amount of G in the first epitaxial layer is smaller than an amount of Ge in the second epitaxial layer.

In accordance with another aspect of the present disclosure, in a method for manufacturing a semiconductor device, a fin structure is formed over a substrate. The fin structure includes a channel layer exposed from an isolation insulating layer. A gate structure including a gate electrode layer and a gate dielectric layer is formed over part of the fin structure. Sidewall spacers are formed over opposite side faces of the gate structure. A recess is formed by removing part of the fin structure not covered by the gate structure. The recess is treated to form an octagonal recess. A source and a drain are formed in the octagonal recess, each including an epitaxial layer. The recess is defined by seven faces of the fin structure. In one or more of the foregoing or the following embodiments, the treating the recess includes applying a mixture of at least one selected from the group consisting of silicon hydride, silicon halide and silicon hydride-halide, and at least one selected from the group consisting of HCl, $NH_3$, $NF_3$, $NH_2Cl$, $CF_4$, $CH_3F$, $CHF_3$ and HF. In one or more of the foregoing or the following embodiments, the mixture includes $SiH_4$, HCl and $H_2$. In one or more of the foregoing or the following embodiments, the treating is performed at a temperature in a range from 300° C. to 900° C. In one or more of the foregoing or the following embodiments, the treating is performed under a pressure in a range from 1 Torr to 500 Torr. In one or more of the foregoing or the following embodiments, the treating is performed for a time duration in a range from 60 sec to 120. In one or more of the foregoing or the following embodiments, the recess is formed by an isotropic etching. In one or more of the foregoing or the following embodiments, one of the seven faces is a (110) face. In one or more of the foregoing or the following embodiments, the (110) face is parallel to a side face of the gate electrode. In one or more of the foregoing or the following embodiments, one of the seven faces is a (100) face. In one or more of the foregoing or the following embodiments, the (100) face is a bottom face. In one or more of the foregoing or the following embodiments, a length of the (110) face is at least 5 nm. In one or more of the foregoing or the following embodiments, in the treating the recess, a ratio of an etching rate of a (110) face to an etching rate of a (100) face is in a range from 5 to 10.

In accordance another aspect of the present disclosure, in a method for manufacturing a semiconductor device, a fin structure is formed over a substrate. The fin structure includes a channel layer made of SiGe and exposed from an isolation insulating layer. A gate structure including a gate electrode layer and a gate dielectric layer is formed over part of the fin structure. Sidewall spacers are formed over opposite side faces of the gate structure. A recess is formed by removing part of the fin structure not covered by the gate structure. The recess is reshaped to form an octagonal recess. A source and a drain are formed in the octagonal recess, each including an epitaxial layer. The recess is defined by at least seven faces of the fin structure. In one or more of the foregoing or the following embodiments, the reshaping the recess is performed by chemical etching using a gas containing $SiH_4$ and HCl.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a fin structure disposed over a substrate, the fin structure including a channel layer and extending in a first direction;
gate structures disposed over the fin structure and each including a gate electrode layer and a gate dielectric layer;
sidewall spacers disposed on opposite sides of each of the gate structures; and
a source/drain structure including an epitaxial layer having at least two (110) facets, one (100) facet and two (111) facets, as interfaces between the epitaxial layer and the fin structure, wherein:
the epitaxial layer includes a first epitaxial layer and a second epitaxial layer disposed on the first epitaxial layer, and
a bottom of the second epitaxial layer is located above a level at which the two (110) facets are connected to the two (111) facets, respectively.

2. The semiconductor device of claim 1, wherein the two (110) facets are parallel to side faces of the gate electrodes.

3. The semiconductor device of claim 2, wherein the (100) facet is connected to the two (111) facets and is a bottom face.

4. The semiconductor device of claim 1, wherein a length of each of the two (110) facets is in a range from 5 nm to 25 nm.

5. The semiconductor device of claim 1, wherein the each of the two (110) facets is located below a corresponding one of the sidewall spacers.

6. The semiconductor device of claim 1, wherein the source/drain structure protrudes above a top of the fin structure.

7. The semiconductor device of claim 1, wherein:
the epitaxial layer further has additional two (111) facets, and
a length of each of the additional two (111) facets is smaller than a length of each of the two (111) facets.

8. The semiconductor device of claim 1, wherein:
the first epitaxial layer includes SiP,
the second epitaxial layer includes SiP, and
a concentration of P in the first epitaxial layer is greater than a concentration of P in the second epitaxial layer.

9. The semiconductor device of claim 1, wherein:
the first epitaxial layer includes SiGe,
the second epitaxial layer includes SiGe, and
an amount of Ge in the first epitaxial layer is smaller than an amount of Ge in the second epitaxial layer.

10. A method for manufacturing a semiconductor device, comprising:
forming a first semiconductor layer over a substrate;
forming a second semiconductor over the first semiconductor layer;
forming a fin structure by an patterning operation, the fin structure including a part of the first semiconductor layer and a part of the second semiconductor layer;
forming a gate structure over the fin structure;
forming a recess by etching the part of the first semiconductor layer of the fin structure;
treating the recess to form an octagonal recess having seven facets; and
forming a source/drain structure in the octagonal recess, the source/drain structure including an epitaxial layer.

11. The method of claim 10, wherein the forming the recess includes applying a mixture of $NH_3$, $NF_3$, $H_2$ and He.

12. The method of claim 10, wherein the treating the recess includes applying a mixture including $SiH_4$, HCl and $H_2$.

13. The method of claim 11, wherein the treating is performed at a temperature in a range from 600° C. to 800° C.

14. The method of claim 11, wherein the treating is performed under a pressure in a range from 5 Torr to 50 Torr.

15. The method of claim 10, wherein after the treating is performed, a surface roughness Ra of the (110) surface is less than 0.4 nm.

16. The method of claim 10, wherein a depth of the recess measured from a top of the fin structure is in a range from 25 nm to 90 nm.

17. The method of claim 11, wherein in the treating the recess, the recess comprises an (110) surface of which surface roughness Ra is in a range from 0.05 nm to 0.4 nm.

18. A semiconductor device, comprising:
a fin structure disposed over a substrate, the fin structure including a channel layer and a well layer made of a different material than the channel layer;
a gate structure disposed over the fin structure and including a gate electrode layer and a gate dielectric layer; and
a source/drain epitaxial layer embedded in a recess formed in fin structure and having at least two (110) facets, one (100) facet and two (111) facets,
wherein the recess has a bottom smaller than an opening of the recess.

19. The semiconductor device of claim 18, wherein:
the epitaxial layer further has additional two (111) facets, and
a length of each of the additional two (111) facets is smaller than a length of each of the two (111) facets.

20. The semiconductor device of claim 18, wherein:
the source/drain epitaxial layer includes a first epitaxial layer and a second epitaxial layer disposed on the first epitaxial layer, and
a bottom of the second epitaxial layer is located above a level at which the two (110) facets are connected to the two (111) facets, respectively.

* * * * *